United States Patent
Li

(10) Patent No.: US 11,695,091 B2
(45) Date of Patent: Jul. 4, 2023

(54) TRANSFER METHOD, DISPLAY DEVICE, AND STORAGE MEDIUM

(71) Applicant: CHONGQING KONKA PHOTOELECTRIC TECHNOLOGY RESEARCH INSTITUTE CO., LTD., Chongqing (CN)

(72) Inventor: Qiang Li, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 194 days.

(21) Appl. No.: 17/347,144

(22) Filed: Jun. 14, 2021

(65) Prior Publication Data

US 2021/0359156 A1 Nov. 18, 2021

Related U.S. Application Data

(63) Continuation of application No. PCT/CN2020/090290, filed on May 14, 2020.

(51) Int. Cl.
  *H01L 33/00* (2010.01)
  *H01L 25/075* (2006.01)

(52) U.S. Cl.
  CPC ...... *H01L 33/0095* (2013.01); *H01L 25/0753* (2013.01); *H01L 33/0093* (2020.05)

(58) Field of Classification Search
  None
  See application file for complete search history.

(56) References Cited

U.S. PATENT DOCUMENTS

2003/0189212 A1* 10/2003 Yoo .......................... H01L 33/32
  257/79
2010/0026779 A1* 2/2010 Yonehara ................... B41J 2/45
  438/34

FOREIGN PATENT DOCUMENTS

| CN | 110828364 A | 2/2020 |
| CN | 110998824 A | 4/2020 |
| CN | 111048634 A | 4/2020 |
| CN | 111063649 A | 4/2020 |

(Continued)

OTHER PUBLICATIONS

International Search Report issued in corresponding International Application No. PCT/CN2020/090290, dated Jan. 27, 2021, pp. 1-9, Beijing, China.

*Primary Examiner* — Bradley Smith
(74) *Attorney, Agent, or Firm* — Hauptman Ham, LLP

(57) ABSTRACT

Provided are a transfer method, a display device, and a storage medium. The transfer method includes: performing partial cutting on preset scribe lines (22) on an epitaxial layer to obtain to-be-transferred wafers (24) after cutting (S1); adhering a temporary substrate (26) on the to-be-transferred wafers (24) through adhering a first release adhesive (25) to first side faces of the to-be-transferred wafers (24), and removing a growth substrate (21) (S2); adhering the to-be-transferred wafers (24) to the blue tape (28) through adhering a second release adhesive (27) to second side faces of the to-be-transferred wafers (24), and removing the temporary substrate (26) (S3); jacking up the blue tape (28) with a roller so that remaining scribe lines (23) on the to-be-transferred wafers (24) are separated by breaking under action of stress (S4).

20 Claims, 2 Drawing Sheets

(56) References Cited

FOREIGN PATENT DOCUMENTS

| | | |
|---|---|---|
| CN | 111128789 A | 5/2020 |
| KR | 20150073526 A | 7/2015 |

\* cited by examiner

TRANSFER METHOD, DISPLAY DEVICE, AND STORAGE MEDIUM

CROSS-REFERENCE TO RELATED APPLICATION (S)

This application is a continuation of International Application No. PCT/CN2020/090290, filed on May 14, 2020, the disclosure of which is hereby incorporated by reference in its entirety.

TECHNICAL FIELD

The disclosure belongs to the technical field of LED display, particularly relates to a transfer method, a display device, and a storage medium.

BACKGROUND

Micro Light Emitting Diode (micro-LED) technology, namely LED miniaturization and matrix technology, has the advantages of good stability, long service life, and good operating temperature, while also inheriting the advantages such as low power consumption and color saturation, fast response, and strong contrast of LED. As micro-LEDs have higher brightness and lower power consumption, the micro-LEDs have broad application prospects.

In production processes of related LED display devices, it is necessary to transfer LED chips on growth substrates for three times. Specifically, the first transfer refers to transferring the LED chips on the growth substrates to first temporary substrates, and the second transfer refers to transferring the LED chips on the first temporary substrates to second temporary substrates, and the third transfer refers to transferring the LED chips on the second temporary substrates to display backplanes. In these three transfer processes, a photolytic adhesive and a pyrolytic adhesive are needed. However, since the two kinds of adhesive materials have a certain thickness and fluidity and a thickness of each LED chip is only a few microns, the adhesive materials are easy to spill to cover the LED chips, resulting in a low transfer success rate.

Therefore, further improvement is needed for the related art.

SUMMARY

In a first aspect, the disclosure provides a transfer method, including: performing partial cutting on preset scribe lines on an epitaxial layer on a growth substrate to obtain to-be-transferred wafers after cutting, herein a cutting depth is less than a depth of the epitaxial layer; providing a temporary substrate having a first release adhesive, adhering the first release adhesive to first side faces of the to-be-transferred wafers so as to adhere the to-be-transferred wafers to a temporary substrate, and peeling off the growth substrate; providing a blue tape having a second release adhesive, adhering second release adhesive to second side faces of the to-be-transferred wafers so as to adhere the to-be-transferred wafers to the blue tape, and peeling off the temporary substrate, herein the first side faces and the second side faces are arranged in opposite, correspondingly; and providing a roller that is arranged at the bottom of the blue tape and opposite to the to-be-transferred wafers, and jacking up the blue tape with the roller so that remaining scribe lines on the to-be-transferred wafers are automatically separated by breaking under action of stress.

In the above transfer method, before transfer of the wafers, the scribe lines on the epitaxial layer of the growth substrate are subjected to partial cutting, leaving part of areas uncut among the to-be-transferred wafers; during transfer of the wafers, the part of uncut areas may block spill adhesive materials and prevent the to-be-transferred wafers from being covered with the adhesive materials, so that the LED chip transfer success rate is increased. Moreover, an interaction force provided by the part of uncut areas prevents the relative position of the wafers from changing, thereby further increasing the LED chip transfer success rate.

In an embodiment, the remaining scribe lines are V-shaped or U-shaped.

In the foregoing implementation process, after the blue tape is jacked up by the roller, uncut areas at the lower ends of the V-shaped or U-shaped remaining scribe lines are thin, and accordingly may be broken preferentially under action of stress. The to-be-transferred wafers are spaced from the remaining scribe lines by a certain distance, so that damage to edges of the to-be-transferred wafers is avoided.

In an embodiment, the operation of adhering the first release adhesive to first side faces of the to-be-transferred wafers so as to adhere the to-be-transferred wafers to a temporary substrate, and peeling off the growth substrate includes: coating or attaching the temporary substrate with the first release adhesive to fix the temporary substrate on one surface, opposite to the growth substrate, of each to-be-transferred wafer; and peeling off the growth substrate by means of laser lift-off to transfer the to-be-transferred wafers to the temporary substrate.

In an embodiment, the operation of adhering second release adhesive to second side faces of the to-be-transferred wafers so as to adhere the to-be-transferred wafers to the blue tape, and peeling off the temporary substrate includes: coating or attaching the blue tape with the second release adhesive to fix the blue tape on one surface, opposite to the temporary substrate, of each to-be-transferred wafer; and peeling off the temporary substrate when a release condition of the second release adhesive is satisfied, so as to transfer the to-be-transferred wafer to the blue tape.

In an embodiment, the operation of providing a roller that is arranged at the bottom of the blue tape and opposite to the to-be-transferred wafers, and jacking up the blue tape with the roller so that the remaining scribe lines on the to-be-transferred wafers are automatically separated by breaking under action of stress includes: providing a roller arranged on one surface, away from the to-be-transferred wafers, of the blue tape; the roller is disposed in the middle of the remaining scribe lines; and jacking up the blue tape by the roller to cause the remaining scribe lines on the to-be-transferred wafers to be broken under action of stress so that the to-be-transferred wafers are automatically separated by breaking.

In an embodiment, the method, after the operation of separating the growth substrate by means of laser lift-off to transfer the to-be-transferred wafer to the temporary substrate, further includes: washing one surface, touching the growth substrate, of each to-be-transferred wafer by hydrochloric acid. Residual metal gallium may exist on a surface of the to-be-transferred wafer in contact with the growth substrate. The surface of the to-be-transferred wafer in contact with the growth substrate is washed to facilitate transfer of the to-be-transferred wafer to the blue tape in the subsequent operations.

In an embodiment, the first release adhesive and the second release adhesive have different release conditions. When a release condition of the first release adhesive is satisfied, adhesiveness of the first release adhesive is reduced while adhesiveness of the second release adhesive is unchanged, so that the to-be-transferred wafers are transferred to the blue tape.

In an embodiment, the first release adhesive refers to a photolytic adhesive, and the second release adhesive refers to a pyrolytic adhesive; peeling off the temporary substrate when the release condition of the second release adhesive is satisfied includes: irradiating the temporary substrate with laser to remove the adhesiveness of the second release adhesive so as to separate the temporary substrate from the to-be-transferred wafers.

In an embodiment, the first release adhesive refers to a pyrolytic adhesive, and the second adhesive refers to a photolytic adhesive; peeling off the temporary substrate when a release condition of the second release adhesive is satisfied includes: heating the temporary substrate to remove the adhesiveness of the second release adhesive so as to separate the temporary substrate from the to-be-transferred wafers.

In a second aspect, the disclosure further provides a display device that includes a display substrate fixedly provided with LED chips, and the LED chips are transferred by the transfer method of the first aspect.

In a third aspect, the disclosure further provides a non-transitory computer readable storage medium. The non-transitory computer readable storage medium is configured to store a computer program which, when executed by a processor, causes the processor to execute the transfer method of the first aspect.

Figure 1:
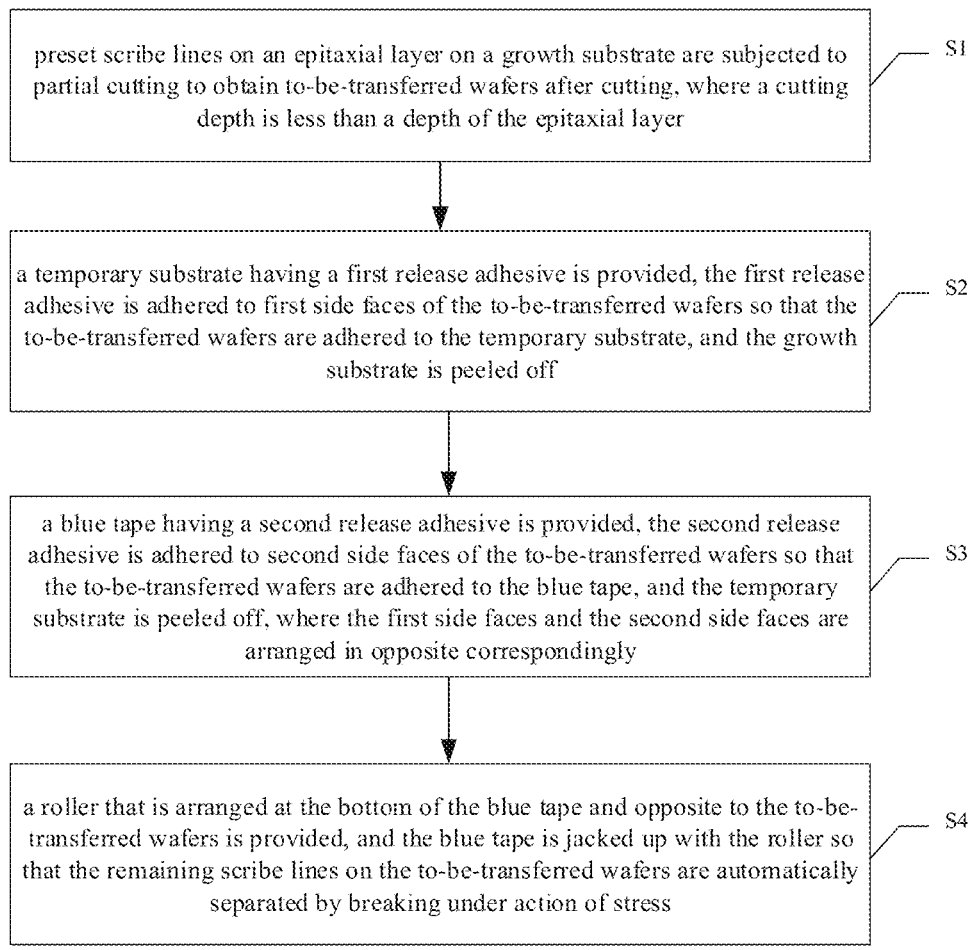
FIG. 1 is a flowchart of an embodiment of a transfer method provided by an embodiment of the disclosure.

REFERENCE SIGNS 21-growth substrate; 22-preset scribe line; 23-remaining scribe line; 24-to-be-transferred wafer; 25-first release adhesive; 26-temporary substrate; 27-second release adhesive; and 28-blue tape.

DETAILED DESCRIPTION

To facilitate understanding this application, this application will be described more comprehensively below with reference to the related drawings. Preferred implementations of this application are provided in the drawings. This application may be implemented in different manners and is not limited to the implementations described herein. Conversely, these implementations are provided to intend to make the understanding of the disclosure of this application more thorough and comprehensive.

Unless otherwise defined, all technical and scientific terms used herein have the same meaning as commonly understood by those skilled in the art of this application. The terms used in the specification of this application herein are only for the purpose of describing the implementations, and are not intended to limit this application.

In production processes of related LED display devices, it is necessary to transfer LED chips on growth substrates for three times. In these three transfer processes, a photolytic adhesive and a pyrolytic adhesive are needed. However, since the two kinds of adhesive materials have a certain thickness and fluidity, and a thickness of each LED chip is only a few microns, the adhesive materials are easy to spill to cover the LED chips, resulting in a low transfer success rate.

Based on this, this application is intended to provide a solution that can solve the above-mentioned technical problems, the details of which will be described in subsequent embodiments.

Referring to FIG. 1, the disclosure provides a transfer method, including the following operations.

At S1, preset scribe lines on an epitaxial layer on a growth substrate are subjected to partial cutting to obtain to-be-transferred wafers after cutting, where a cutting depth is less than a depth of the epitaxial layer.

The preset scribe lines refers to a plurality of scribe lines that may be reserved to facilitate dicing of epitaxial crystal after growth of the epitaxial crystal on the growth substrate.

Figure 2:
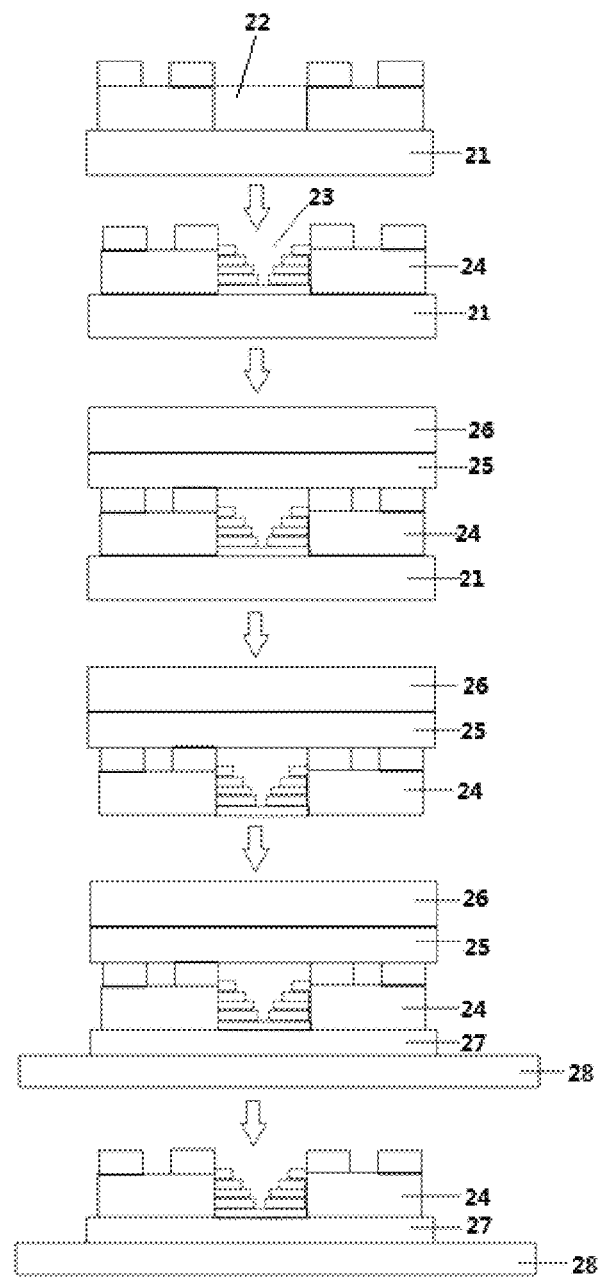
FIG. 2 is a schematic diagram of procedures of a transfer method provided by an embodiment of the disclosure.

As an implementation, as shown in FIG. 2 which is a schematic diagram of procedures of a transfer method provided by an embodiment of the disclosure, in order to solve the problem of adhesive spilling during LED chip transfer, after wafers are prepared on a growth substrate 21, preset scribe lines 22 on an epitaxial layer on the growth substrate 21 are subjected to partial cutting to obtain to-be-transferred wafers 24 after cutting, and a scribing depth of the preset scribe lines 22 is less than a depth of the epitaxial layer; remaining scribe lines 23 are formed among the to-be-transferred wafers 24, which can block spill adhesive materials during transfer of the to-be-transferred wafers 24, so as to prevent the to-be-transferred wafers 24 from being covered with the adhesive materials, so that the LED chip transfer success rate is increased; moreover, an interaction force provided by the remaining scribe lines 23 prevents the relative position of the to-be-transferred wafers 24 from changing, thereby further increasing the LED chip transfer success rate.

At S2, a temporary substrate having a first release adhesive is provided, the first release adhesive is adhered to first side faces of the to-be-transferred wafers so that the to-be-transferred wafers are adhered to the temporary substrate, and the growth substrate is peeled off.

As an implementation, after the preset scribe lines on the epitaxial layer on the growth substrate are subjected to partial cutting and the remaining scribe lines 23 are formed among the to-be-transferred wafers 24, a temporary substrate 26 is further provided, which is provided with a first release adhesive 25. The first release adhesive 25 is adhered to the first side faces of the to-be-transferred wafers 24, so that the to-be-transferred wafers 24 are adhered to the temporary substrate 26 through the first release adhesive 25. At last, the growth substrate 21 is peeled off and thus the to-be-transferred wafers 24 are transferred to the temporary substrate 26. In this process, although the first release adhesive 25 has a certain thickness and fluidity, the remaining scribe lines 23 among the to-be-transferred wafers 24 may prevent spill of the first release adhesive 25 from covering the to-be-transferred wafers 24.

In an embodiment, the first release adhesive 25 is a photolytic adhesive or a pyrolytic adhesive.

In an implementation, the operation S2 includes the followings.

At S21, the temporary substrate is coated or attached with the first release adhesive to fix the temporary substrate on one surface, opposite to the growth substrate, of each to-be-transferred wafer.

At S22, the growth substrate is separated by means of laser lift-off to transfer the to-be-transferred wafers to the temporary substrate.

During implementing, the first side face of each to-be-transferred wafer 24 is a surface opposite to the growth substrate 21; the preset scribe lines 22 on the epitaxial layer on the growth substrate 21 are subjected to partial cutting to obtain the to-be-transferred wafers 24 after cutting; the first release adhesive 25 is coated or attached on the temporary substrate 26, and the temporary substrate 26 is fixed to one surface, opposite to the growth substrate 21, of each to-be-transferred wafer 24 through the first release adhesive 25; the growth substrate 21 is then separated by means of laser lift-off to transfer the to-be-transferred wafers 24 to the temporary substrate 26. In this process, although the first release adhesive 25 has a certain thickness and fluidity, the remaining scribe lines 23 among the to-be-transferred wafers 24 may prevent spill of the first release adhesive 25 from covering the to-be-transferred wafers 24.

In an implementation, the following is further included after the operation S22.

At S23, a surface, touching the growth substrate, of each to-be-transferred wafer is washed with hydrochloric acid.

During implementing, after the growth substrate 21 is separated by means of laser lift-off, residual metal gallium may exist on the surface of the to-be-transferred wafer 24 in contact with the growth substrate 21. In order to achieve the subsequent operation of fixing the blue tape 28 to the to-be-transferred wafer 24 through the second release adhesive 27, the surface of the to-be-transferred wafer 24 in contact with the growth substrate 21 is washed with hydrochloric acid further in the embodiment so as to remove residual metal gallium. Due to corrosivity of concentrated hydrochloric acid, in order to prevent hydrochloric acid from corroding the to-be-transferred wafer 24, dilute hydrochloric acid is used in the embodiment to wash the surface of the to-be-transferred wafers 24 in contact with the growth substrate 21.

During implementing, the first release adhesive 25 and the second release adhesive 27 include, but are not limited to a UV photolytic adhesive, a pyrolytic adhesive, and a cold-decomposed adhesive. The first release adhesive 25 and the second release adhesive 27 have different release conditions, and therefore the temporary substrate 26 can be removed when the release condition of the first release adhesive 25 is satisfied, without affecting the second release adhesive 27.

At S3, a blue tape having a second release adhesive is provided, the second release adhesive is adhered to second side faces of the to-be-transferred wafers so that the to-be-transferred wafers are adhered to the blue tape, and the temporary substrate is peeled off, where the first side faces and the second side faces are arranged in opposite correspondingly.

During implementing, after the to-be-transferred wafers 24 are transferred to the temporary substrate 26, the blue tape 28 is further provided, which is provided with the second release adhesive 27. The second release adhesive 27 is adhered to the second side faces, opposite to the foregoing first side faces, of the to-be-transferred wafers 24, so that the to-be-transferred wafers 24 are adhered to the blue tape 28 through the second release adhesive 27. At last, the temporary substrate 26 is peeled off so that the to-be-transferred wafers 24 are transferred to the blue tape 28. In this process, although the first second adhesive 27 has a certain thickness and fluidity, the remaining scribe lines 23 among the to-be-transferred wafers 24 may prevent spill of the second release adhesive 27 from covering the to-be-transferred wafers 24.

In an embodiment, the second release adhesive 27 is a pyrolytic adhesive or a photolytic adhesive.

It is to be noted that the first release adhesive 25 and the second release adhesive 27 are different. That is, when the first release adhesive 25 is a photolytic adhesive, the second release adhesive 27 is a pyrolytic adhesive. Conversely, when the first release adhesive 25 is a pyrolytic adhesive, and the second release adhesive is a photolytic adhesive.

In an implementation, the operation S3 includes the followings.

At S31, the blue tape is coated or attached with the second release adhesive to fix the blue tape on one surface, opposite to the temporary substrate, of each to-be-transferred wafer.

At S32, the temporary substrate is removed and thus the to-be-transferred wafer is transferred to the blue tape.

During implementing, the second side face of each to-be-transferred wafer 24 is a surface, opposite to the temporary substrate 26, of the to-be-transferred wafer 24; after the to-be-transferred wafer 24 is transferred to the temporary substrate 26, the first release adhesive 27 is coated or attached on the temporary substrate 28, and the temporary substrate 28 is fixed to one surface, opposite to the growth substrate 26, of the to-be-transferred wafer 24 through the first release adhesive 27; then the temporary substrate 26 is removed and thus the to-be-transferred wafer 24 is transferred to the blue tape 28. In this process, although the second release adhesive 27 has a certain thickness and fluidity, the remaining scribe lines 23 among the to-be-transferred wafers 24 may prevent spill of the second release adhesive 27 from covering the to-be-transferred wafers 24.

In an implementation, the first release adhesive 25 is a photolytic adhesive, and the second release adhesive 27 is a pyrolytic adhesive. Removing the temporary substrate in the operation S32 includes the followings.

At S321, the temporary substrate is irradiated with laser to remove adhesiveness of the second release adhesive so as to separate the temporary substrate from the to-be-transferred wafer.

During implementing, when the first release adhesive 25 is a photolytic adhesive, and the second release adhesive 27 is a pyrolytic adhesive, the blue tape 28 is fixed to one surface, opposite to the temporary substrate 26, of each to-be-transferred wafer 24 through the second release adhesive 27, the temporary substrate 26 is irradiated, the first release adhesive 25 is decomposed under an irradiation condition, so that the to-be-transferred wafer 24 is separated from the temporary substrate 26 and the to-be-transferred wafer 24 is transferred to the blue tape 28. In an embodiment, a laser with a wavelength of 266 nm is used to irradiate the temporary substrate 26 to reduce the adhesiveness of the first release adhesive 25 on the temporary substrate 26 so as to transfer the to-be-transferred wafer 24 to the blue tape 28.

In an implantation, the first release adhesive 25 is a pyrolytic adhesive, and the second release adhesive 27 is a photolytic adhesive. Removing the temporary substrate in the operation S32 includes the following.

At S321', the temporary substrate is heated to remove the adhesiveness of the second release adhesive so as to separate the temporary substrate from the to-be-transferred wafer.

During implementing, when the first release adhesive 25 is a pyrolytic adhesive, and the second release adhesive 27 is a photolytic adhesive, after the blue tape 28 is fixed to one surface, opposite to the temporary substrate 26, of each to-be-transferred wafer 24 through the second release adhesive 27, the temporary substrate 26 is heated, the first release adhesive 25 is decomposed under a heating condition, so that the to-be-transferred wafer 24 is separated from the temporary substrate 26, and the to-be-transferred wafer 24 is transferred to the blue tape 28.

In an implementation, the following is further included after the operation S3.

At S41, a roller is provided, which is arranged on one surface, away from the to-be-transferred wafers, of the blue tape; herein the roller is disposed in the middle of the remaining scribe lines.

At S42, the blue tape is jacked up with the roller to cause the remaining scribe lines on the to-be-transferred wafers to be broken under action of stress so that the to-be-transferred wafers are automatically separate by breaking.

During implementing, the remaining scribe lines 23 are V-shaped or U-shaped scribe lines, after the to-be-transferred wafers 24 are transferred to the blue tape 28, the roller is adopted to jack up the blue tape 28 to break the to-be-transferred wafers 24. Specifically, the roller is arranged on one surface, away from the to-be-transferred wafers 24, of the blue tape 28, and the roller is disposed in the middle of the remaining scribe lines 23; and then, the roller jacks up the blue tape 28 to break the plurality of to-be-transferred wafers 24 on the blue tape 28. The uncut areas at the lower ends of the V-shaped or U-shaped remaining scribe lines 23 which are thin may be broken preferentially. After break, the roller must stop jacking up, thereby preventing break of the to-be-transferred wafers 24. During break of the to-be-transferred wafers 24, the to-be-transferred wafers 24 are spaced from the remaining scribe lines 23 by a certain distance, so that damage to edges of the to-be-transferred wafers 24 is avoided.

At S4, a roller that is arranged at the bottom of the blue tape and opposite to the to-be-transferred wafers is provided, and the blue tape is jacked up with the roller so that the remaining scribe lines on the to-be-transferred wafers are automatically separated by breaking under action of stress.

During implementing, after the to-be-transferred wafers 24 are transferred onto the blue tape 28, the roller is further provided; the roller is arranged at the bottom of the blue tape 28 and arranged opposite to the to-be-transferred wafers 24; the blue tape 28 is jacked up with the roller so that the remaining scribe lines 23 are broken under action of stress, resulting in automatic break of the to-be-transferred wafers 24. The to-be-transferred wafers 24 are spaced from the remaining scribe lines 23 by a certain distance, so that damage to edges of the to-be-transferred wafers 24 is avoided.

In an implementation, the followings are further included before the operation S1.

At S01, a growth substrate is provided.

At S02, an epitaxial layer is formed on the growth substrate.

During implementing, in this embodiment, a growth substrate 21 is first provided. The growth substrate 21 may include, but is not limited to, sapphire, silicon carbide, or silicon; then, an epitaxial layer is formed on the growth substrate 21 by means such as MOCVD; finally, the epitaxial layer is formed on the growth substrate 21. Multiple processes such as etching, electrode growth, and thinning are performed on the epitaxial layer to prepare wafers fixed on the growth substrate 21.

In an implementation, the disclosure further provides a display device that includes a display substrate fixedly provided with LED chips, and the LED chips are transferred by the transfer method. By application of the above transfer method, before transfer of the LED chips, the preset scribe lines on the epitaxial layer on the growth substrate are subjected to partial cutting, leaving part of areas uncut among the to-be-transferred wafers; during transfer of the wafers, the part of uncut areas may block spill adhesive materials and prevent the to-be-transferred wafers from being covered with the adhesive materials; moreover, an interaction force provided by the part of uncut areas prevents the relative position of the wafers from changing, so that an LED chip transfer success rate is increased, production cost of the display device is lowered, and production efficiency of the display is increased.

In an implementation, the disclosure further provides a non-transitory computer readable storage medium. The non-transitory computer readable storage medium is configured to store a computer program which, when executed by a processor, causes the processor to execute the above transfer method.

In summary, the disclosure provides a transfer method, a display device, and a non-transitory computer readable storage medium. The transfer method includes: performing partial cutting on preset scribe lines on an epitaxial layer on a growth substrate to obtain to-be-transferred wafers after cutting, herein a cutting depth is less than a depth of the epitaxial layer; providing a temporary substrate having a first release adhesive, adhering the first release adhesive to first side faces of the to-be-transferred wafers so as to adhere the to-be-transferred wafers to a temporary substrate, and peeling off the growth substrate; providing a blue tape having a second release adhesive, adhering second release adhesive to second side faces of the to-be-transferred wafers so as to adhere the to-be-transferred wafers to the blue tape, and peeling off the temporary substrate, herein the first side faces and the second side faces are arranged in opposite, correspondingly; and providing a roller that is arranged at the bottom of the blue tape and opposite to the to-be-transferred wafers, and jacking up the blue tape with the roller so that the remaining scribe lines on the to-be-transferred wafers are automatically separated by breaking under action of stress. According to this application, the preset scribe lines on the epitaxial layer on the growth substrate are subjected to partial cutting, leaving part of areas uncut among the to-be-transferred wafers; during transfer of the to-be-transferred wafers, the part of uncut areas may block spill adhesive materials and prevent the to-be-transferred wafers from being covered with the adhesive materials, so that an LED chip transfer success rate is increased. Moreover, an interaction force provided by the part of uncut areas prevents the relative position of the to-be-transferred wafers from changing, thereby further increasing the LED chip transfer success rate.

It is to be understood that applications of the disclosure are not limited to the examples described above, those skilled in the art may make modifications or variations according to the foregoing description, and all these modifications and variations shall fall into the scope of protection of the disclosure.

What is claimed is:
1. A transfer method, comprising:
    performing partial cutting on preset scribe lines on an epitaxial layer on a growth substrate to obtain to-be-transferred wafers after cutting, wherein a cutting depth is less than a depth of the epitaxial layer;
    providing a temporary substrate having a first release adhesive, adhering the first release adhesive to first side faces of the to-be-transferred wafers so as to adhere the to-be-transferred wafers to the temporary substrate, and peeling off the growth substrate;

providing a blue tape having a second release adhesive, adhering the second release adhesive to second side faces of the to-be-transferred wafers so as to adhere the to-be-transferred wafers to the blue tape, and peeling off the temporary substrate, wherein the first side faces and the second side faces are arranged in opposite correspondingly; and providing a roller that is arranged at the bottom of the blue tape and opposite to the to-be-transferred wafers, and jacking up the blue tape with the roller so that remaining scribe lines on the to-be-transferred wafers are separated by breaking under action of stress.

2. The transfer method according to claim 1, wherein the remaining scribe lines are V-shaped or U-shaped.

3. The transfer method according to claim 2, wherein adhering the first release adhesive to the first side faces of the to-be-transferred wafers so as to adhere the to-be-transferred wafers to a temporary substrate, and peeling off the growth substrate comprise:

coating or attaching the temporary substrate with the first release adhesive to fix the temporary substrate on one surface, opposite to the growth substrate, of each to-be-transferred wafer; and separating the growth substrate by means of laser lift-off to transfer the to-be-transferred wafers to the temporary substrate.

4. The transfer method according to claim 3, wherein adhering the second release adhesive to the second side faces of the to-be-transferred wafers so as to adhere the to-be-transferred wafers to the blue tape, and peeling off the temporary substrate comprise:

coating or attaching the blue tape with the second release adhesive to fix the blue tape on one surface, opposite to the temporary substrate, of each to-be-transferred wafer; and peeling off the temporary substrate when a release condition of the second release adhesive is satisfied, so as to transfer the to-be-transferred wafers to the blue tape.

5. The transfer method according to claim 4, wherein the first release adhesive and the second release adhesive have different release conditions.

6. The transfer method according to claim 5, wherein the first release adhesive is a photolytic adhesive, and the second release adhesive is a pyrolytic adhesive; and peeling off the temporary substrate when a release condition of the second release adhesive is satisfied comprises:

irradiating the temporary substrate with laser to remove adhesiveness of the second release adhesive so as to separate the temporary substrate from the to-be-transferred wafers.

7. The transfer method according to claim 5, wherein the first release adhesive is a pyrolytic adhesive, and the second adhesive is a photolytic adhesive; and peeling off the temporary substrate when a release condition of the second release adhesive is satisfied comprises:

heating the temporary substrate to remove adhesiveness of the second release adhesive so as to separate the temporary substrate from the to-be-transferred wafers.

8. The transfer method according to claim 2, wherein providing a roller that is arranged at the bottom of the blue tape and opposite to the to-be-transferred wafer, and jacking up the blue tape with the roller so that the remaining scribe lines on the to-be-transferred wafers are separated by breaking under action of stress comprise:

providing a roller arranged on one surface, away from the to-be-transferred wafers, of the blue tape; wherein the roller is disposed in the middle of the remaining scribe lines; and jacking up the blue tape by the roller to cause the remaining scribe lines on the to-be-transferred wafers to be broken under action of stress so that the to-be-transferred wafers are automatically separated by breaking.

9. The transfer method according to claim 3, wherein the method, after separating the growth substrate by means of laser lift-off to transfer the to-be-transferred wafers to the temporary substrate, further comprises:

washing a surface, touching the growth substrate, of each to-be-transferred wafer by hydrochloric acid.

10. A display device, wherein the display device comprises a display substrate fixedly provided with LED chips, and the LED chips are transferred by a transfer method, comprising:

performing partial cutting on preset scribe lines on an epitaxial layer on a growth substrate to obtain to-be-transferred wafers after cutting, wherein a cutting depth is less than a depth of the epitaxial layer;

providing a temporary substrate having a first release adhesive, adhering the first release adhesive to first side faces of the to-be-transferred wafers so as to adhere the to-be-transferred wafers to the temporary substrate, and peeling off the growth substrate;

providing a blue tape having a second release adhesive, adhering the second release adhesive to second side faces of the to-be-transferred wafers so as to adhere the to-be-transferred wafers to the blue tape, and peeling off the temporary substrate, wherein the first side faces and the second side faces are arranged in opposite correspondingly; and providing a roller that is arranged at the bottom of the blue tape and opposite to the to-be-transferred wafers, and jacking up the blue tape with the roller so that remaining scribe lines on the to-be-transferred wafers are separated by breaking under action of stress.

11. The display device according to claim 10, wherein the remaining scribe lines are V-shaped or U-shaped.

12. The display device according to claim 11, wherein adhering the first release adhesive to the first side faces of the to-be-transferred wafers so as to adhere the to-be-transferred wafers to a temporary substrate, and peeling off the growth substrate comprise:

coating or attaching the temporary substrate with the first release adhesive to fix the temporary substrate on one surface, opposite to the growth substrate, of each to-be-transferred wafer; and separating the growth substrate by means of laser lift-off to transfer the to-be-transferred wafers to the temporary substrate.

13. The display device according to claim 12, wherein adhering the second release adhesive to the second side faces of the to-be-transferred wafers so as to adhere the to-be-transferred wafers to the blue tape, and peeling off the temporary substrate comprise:

coating or attaching the blue tape with the second release adhesive to fix the blue tape on one surface, opposite to the temporary substrate, of each to-be-transferred wafer; and peeling off the temporary substrate when a release condition of the second release adhesive is satisfied, so as to transfer the to-be-transferred wafers to the blue tape.

14. The display device according to claim 13, wherein the first release adhesive and the second release adhesive have different release conditions.

15. The display device according to claim 14, wherein the first release adhesive is a photolytic adhesive, and the second release adhesive is a pyrolytic adhesive; and
peeling off the temporary substrate when a release condition of the second release adhesive is satisfied comprises:
irradiating the temporary substrate with laser to remove adhesiveness of the second release adhesive so as to separate the temporary substrate from the to-be-transferred wafers.

16. The display device according to claim 14, wherein the first release adhesive is a pyrolytic adhesive, and the second adhesive is a photolytic adhesive; and
peeling off the temporary substrate when a release condition of the second release adhesive is satisfied comprises:
heating the temporary substrate to remove adhesiveness of the second release adhesive so as to separate the temporary substrate from the to-be-transferred wafers.

17. The display device according to claim 11, wherein providing a roller that is arranged at the bottom of the blue tape and opposite to the to-be-transferred wafer, and jacking up the blue tape with the roller so that the remaining scribe lines on the to-be-transferred wafers are separated by breaking under action of stress comprise:
providing a roller arranged on one surface, away from the to-be-transferred wafers, of the blue tape; wherein the roller is disposed in the middle of the remaining scribe lines; and
jacking up the blue tape by the roller to cause the remaining scribe lines on the to-be-transferred wafers to be broken under action of stress so that the to-be-transferred wafers are automatically separated by breaking.

18. The display device according to claim 12, wherein the method, after separating the growth substrate by means of laser lift-off to transfer the to-be-transferred wafers to the temporary substrate, further comprises:
washing a surface, touching the growth substrate, of each to-be-transferred wafer by hydrochloric acid.

19. A non-transitory computer readable storage medium storing a computer program which, when executed by a processor, causes the processor to:
perform partial cutting on preset scribe lines on an epitaxial layer on a growth substrate to obtain to-be-transferred wafers after cutting, wherein a cutting depth is less than a depth of the epitaxial layer;
provide a temporary substrate having a first release adhesive, adhere the first release adhesive to first side faces of the to-be-transferred wafers so as to adhere the to-be-transferred wafers to the temporary substrate, and peel off the growth substrate;
provide a blue tape having a second release adhesive, adhere the second release adhesive to second side faces of the to-be-transferred wafers so as to adhere the to-be-transferred wafers to the blue tape, and peel off the temporary substrate, wherein the first side faces and the second side faces are arranged in opposite correspondingly; and
provide a roller that is arranged at the bottom of the blue tape and opposite to the to-be-transferred wafers, and jack up the blue tape with the roller so that remaining scribe lines on the to-be-transferred wafers are separated by breaking under action of stress.

20. The non-transitory computer readable storage medium according to claim 19, wherein the remaining scribe lines are V-shaped or U-shaped.

* * * * *